United States Patent
Zhou et al.

(10) Patent No.: US 11,575,352 B2
(45) Date of Patent: Feb. 7, 2023

(54) MATCHING CIRCUIT STRUCTURE FOR EFFECTIVELY SUPPRESSING LOW-FREQUENCY CLUTTER OF POWER AMPLIFIER OF MOBILE PHONE, AND METHOD USING SAME

(71) Applicant: Lansus Technologies Inc., Guangdong (CN)

(72) Inventors: Jiahui Zhou, Guangdong (CN); Bin Hu, Guangdong (CN); Jiashuai Guo, Guangdong (CN); Kai Xuan, Guangdong (CN)

(73) Assignee: LANSUS TECHNOLOGIES INC, Guangdong (CN)

( * ) Notice: Subject to any disclaimer, the term of this patent is extended or adjusted under 35 U.S.C. 154(b) by 296 days.

(21) Appl. No.: 16/956,249

(22) PCT Filed: Sep. 7, 2018

(86) PCT No.: PCT/CN2018/104460
§ 371 (c)(1),
(2) Date: Jun. 19, 2020

(87) PCT Pub. No.: WO2019/119879
PCT Pub. Date: Jun. 27, 2019

(65) Prior Publication Data
US 2020/0321925 A1 Oct. 8, 2020

(30) Foreign Application Priority Data

Dec. 20, 2017 (CN) .......................... 201711383178.9

(51) Int. Cl.
*H03F 3/18* (2006.01)
*H03F 3/181* (2006.01)
(Continued)

(52) U.S. Cl.
CPC ............ *H03F 3/181* (2013.01); *H03F 3/211* (2013.01); *H03F 3/24* (2013.01); *H04B 1/04* (2013.01); *H04B 2001/0408* (2013.01)

(58) Field of Classification Search
CPC . H03F 3/181; H03F 3/211; H03F 3/24; H04B 1/04; H04B 2001/0408
(Continued)

(56) References Cited

U.S. PATENT DOCUMENTS

| 9,685,918 B2 * | 6/2017 | Li | ............................ H03F 3/211 |
| 2004/0124926 A1 * | 7/2004 | Kang | ....................... H03F 3/605 |
| | | | 330/302 |

FOREIGN PATENT DOCUMENTS

| CN | 1858992 A * | 11/2006 |
| CN | 1858992 A | 11/2006 |

(Continued)

OTHER PUBLICATIONS

Machine translation of the specification for CN 1858992 (Year: 2006).*
(Continued)

*Primary Examiner* — Kevin M Burd
(74) *Attorney, Agent, or Firm* — Panitch Schwarze Belisario & Nadel LLP

(57) ABSTRACT

A matching circuit structure for effectively suppressing the low-frequency clutter of a power amplifier of a mobile phone, falling within the technical field of radio frequency Pas is provided. The circuit structure includes an input end, a blocking capacitor, a power amplifier (PA), an output matching network and an output end connected in series; and the matching circuit structure further includes a negative feedback network connected in parallel to a transmission end of the PA; the negative feedback network includes a resonant capacitor, a resonant inductor and a matching inductor; the resonant capacitor and the resonant inductor are connected in parallel to form a frequency selecting network, and the frequency selecting network is connected in series with the matching inductor and to the ground. The matching circuit structure above can be used to effectively suppress the low-frequency clutter of a power amplifier.

7 Claims, 3 Drawing Sheets

(51) Int. Cl.
   *H03F 3/21* (2006.01)
   *H03F 3/24* (2006.01)
   *H04B 1/04* (2006.01)

(58) Field of Classification Search
   USPC .......................................................... 375/297
   See application file for complete search history.

(56) References Cited

FOREIGN PATENT DOCUMENTS

| | | |
|---|---|---|
| CN | 103457550 A | 12/2013 |
| CN | 107370460 A | 11/2017 |
| CN | 108011599 A | 5/2018 |
| JP | S548955 A | 1/1979 |
| JP | 2013125976 A | 6/2013 |

OTHER PUBLICATIONS

Int'l Search Report dated Dec. 10, 2018 in Int'l Application No. PCT/CN2018/104460.

\* cited by examiner

MATCHING CIRCUIT STRUCTURE FOR EFFECTIVELY SUPPRESSING LOW-FREQUENCY CLUTTER OF POWER AMPLIFIER OF MOBILE PHONE, AND METHOD USING SAME

CROSS-REFERENCE TO RELATED APPLICATIONS

This application is a Section 371 of International Application No. PCT/CN2018/104460, filed Sep. 7, 2018, which was published in the Chinese language on Jun. 27, 2019 under International Publication No. WO 2019/119879 A1, which claims priority under 35 U.S.C. § 119 to Chinese Patent Application No. 201711383178.9, filed on Dec. 20, 2017 the disclosures of all of which are incorporated herein by reference.

TECHNICAL FIELD

The present invention belongs to the technical field of radio frequency power amplifiers, and particularly relates to a matching circuit structure for effectively suppressing low-frequency clutter of a power amplifier of a mobile phone and a method using the same.

BACKGROUND

With the development of communication systems, mobile phones are used more and more frequently in our life. Radio frequency power amplifier (PA), as an important component of a mobile phone system, is mainly used for signal amplification and transmission. The radio frequency power amplifier amplifies a modulated radio frequency signal to a certain power value and then transmits it through an antenna. To ensure that the PA has high enough transmission power, it is often necessary to make the signal transmission Gain of the PA high enough to meet the requirement of high power transmission. However, the increase in PA Gain will cause the amplification of clutter signals outside a working frequency band, which will lead to the problem of excessive PA spurs, thus seriously affecting the communication quality.

SUMMARY

The technical problem to be solved by the present invention is to provide a matching circuit structure for effectively suppressing low-frequency clutter of a power amplifier of a mobile phone. By introducing a frequency selective input matching structure, the low-frequency signal amplification capability of a PA is suppressed at an input end, the transmission gain of the PA low-frequency part is reduced, and the amplification of a mobile phone PA low-frequency clutter signal is effectively suppressed.

The matching circuit structure for effectively suppressing the low-frequency clutter of the power amplifier of the mobile phone according to the present invention comprises: a blocking capacitor C2, a power amplifier (PA), an output matching network and an output end connected in series; the matching circuit structure further comprises: a negative feedback network connected in parallel to a transmission end of the PA.

The negative feedback network comprises a resonant capacitor C1, a resonant inductor L1 and a matching inductor L2.

The resonant capacitor C1 and the resonant inductor L1 are connected in parallel to form a frequency selecting network, and the frequency selecting network is connected in series with the matching inductor L2 and to the ground.

Preferably, the matching circuit structure further comprises one or more intermediate amplification units connected between the PA and the output matching network, and wherein each intermediate amplification unit comprises an inter-stage matching network and a PA sequentially connected in series.

Preferably, the PA in each intermediate amplification unit is connected to a back hole in parallel so as to be connected to the ground.

Preferably, the resonant capacitor C1 and resonant inductor L connected in parallel to transmission end of the PA resonate at low frequencies, thereby increasing the negative feedback impedance of a first-stage low-frequency part and reducing the low-frequency signal amplification capability of the PA input end.

Preferably, the PA is a three-stage PA amplification network, and the three-stage PA amplification network comprises a first-stage PA, a negative feedback network, a first inter-stage matching network, a second-stage PA, a second inter-stage matching network and a third-stage PA.

The negative feedback network is connected in parallel to a transmitting end of the first-stage PA.

In addition, the invention also provides a method for suppressing low-frequency clutter by utilizing the matching circuit structure, comprising: connecting the negative feedback network in parallel to the transmission end of the PA of the matching circuit structure.

Preferably, one or more intermediate amplification units are connected between the PA and the output matching network in the matching circuit structure, and each intermediate amplification unit comprises an inter-stage matching network and a PA sequentially connected in series.

Preferably, the PA in each intermediate amplification unit is connected to a back hole in parallel so as to be connected to the ground.

Preferably, the resonant capacitor C1 and resonant inductor L1 connected in parallel to the transmission end of the PA resonate at low frequencies, thereby increasing the negative feedback impedance of a first-stage low-frequency part.

By means of the matching circuit structure for effectively suppressing the low-frequency clutter of the power amplifier of the mobile phone provided by the present invention, PA low-frequency clutter signals are effectively suppressed.

The matching circuit structure for effectively suppressing the low-frequency clutter of the clutter of the power amplifier of the mobile phone provided by the present invention is simple and easy to realize.

DETAILED DESCRIPTION OF EMBODIMENTS

In order to better understand the scheme and advantages in various aspects of the invention, the specific implementation of the present invention will be described in more detail with reference to the drawings and embodiments below. However, the specific implementation and embodiments described below are for illustrative purposes only and are not intended to limit the present invention.

Figure 1:
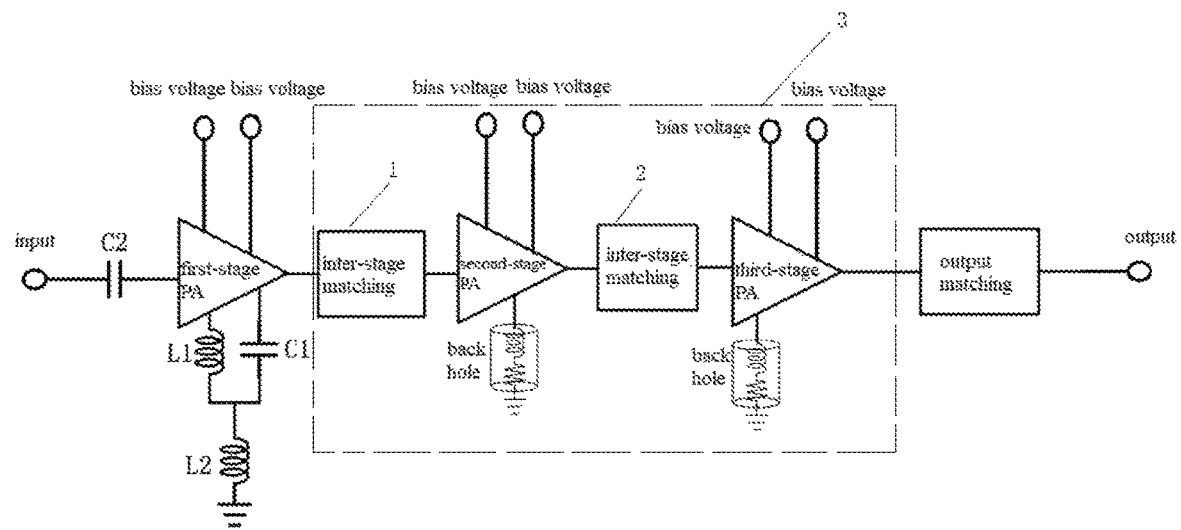
FIG. 1 is a PA circuit structure according to the present invention.

Referring to FIG. 1, an embodiment of the present invention provides a matching circuit structure for effectively suppressing low-frequency clutter of the power amplifier of the mobile phone. A further detailed description will be given below with reference to embodiments and drawings.

In the embodiment of the present invention, a three-stage power amplifier design structure is adopted, so that an output end can get larger output power and gain. As shown in FIG. 1, the matching circuit structure comprises an input blocking capacitor C2, a first-stage PA, a negative feedback network, an inter-stage matching network 1, a second-stage PA, an inter-stage matching network 2, a third-stage PA, and an output matching network. An input end of the matching circuit structure is connected to the output end in series through the input capacitor C2, the first-stage PA, the inter-stage matching network 1, the second-stage PA, the inter-stage matching network 2, the third-stage PA and the output matching network in sequence.

The negative feedback network is connected in parallel to a transmitting end of the first-stage PA. The negative feedback network comprises a resonant capacitor C1, a resonant inductor L1 and a matching inductor L2. The resonant capacitor C1 and the resonant inductor L1 are connected in parallel to form a frequency selecting network, and the frequency selecting network is connected in series with the matching inductor L2 and to the ground.

As shown in FIG. 1, a signal is input through the input end, and the input blocking capacitor C2 of the matching circuit structure is mainly used for DC blocking. The signal is amplified for the first time by the first-stage PA, then used as an input of the second-stage PA, and finally output after being amplified by the second-stage PA and the third-stage PA. In this way, greater output power can be generated.

As shown in FIG. 1, the inter-stage matching network 1, the second-stage PA, the inter-stage matching network 2, and the third-stage PA constitute an intermediate amplification unit 3. It should be noted that in the embodiment of the present invention, the intermediate amplification unit 3 is not limited to two stages, and may be one stage or more. According to the matching circuit structure provided by the embodiment of the present invention, one or more PAs are further connected between the first-stage PA and the output matching network, and each additional stage of PA increases the power to a certain extent, thus reducing the bias voltage requirement for each PA and further improving PA stability.

In the implementation of the present invention, the inter-stage matching network 1 or 2 is configured to match the PA connected thereto, and the inter-stage matching network 1 or 2 is configured to match the increased power input to the second-stage PA or the third-stage PA, so that the whole circuit can work in an optimal state. The inter-stage matching network 1 or 2 can adopt a T-type matching network impedor comprising of a capacitor, an inductor and a resistor. The output matching network can comprise an inductor, a resistor and a capacitor. Generally, the resistor can adopt 50 Ohm matching impedance.

The second-stage PA of the matching circuit structure is connected with a back hole in parallel so as to be connected to the ground, and the third-stage PA is connected with a back hole in parallel so as to be connected to the ground. When the signal is amplified by the first stage, because the frequency selecting network resonates at a low frequency, the feedback impedance of the negative feedback network at a low-frequency part is large and the impedance at a high-frequency part is small, thus suppressing the amplification capability of the low-frequency part. The low-frequency signal input to the second-stage PA or the third-stage PA has been suppressed by the first-stage PA and cannot be amplified by the second-stage PA or the third-stage PA, thus suppressing the amplification of the low-frequency signal.

According to the matching circuit structure for effectively suppressing the low-frequency clutter of a power amplifier of a mobile phone, the resonant inductor L1 and the resonant capacitor C1 are connected in parallel to the transmitting end of the first-stage PA to form the frequency selecting network, and by allowing the L1 and the C1 to resonate at low frequencies, negative feedback of the low-frequency part is increased, and the low-frequency signal cannot be amplified by the first-stage PA, thereby suppressing the amplification of the low-frequency signal.

The matching inductor L2 is mainly configured to adjust the input matching of the whole PA, and the magnitude of the inductance L2 will directly affect the input matching.

In addition, the invention also provides a method for suppressing low-frequency clutter by utilizing the matching circuit structure for effectively suppressing the low-frequency clutter of a power amplifier of a mobile phone, comprising: connecting the negative feedback network in parallel to the transmission end of the PA of the matching circuit structure.

One or more intermediate amplification units are connected between the PA and an output matching network in the matching circuit structure, and each intermediate amplification unit comprises an inter-stage matching network and the corresponding PA sequentially connected in series.

The PAs in the intermediate amplification units are connected to back holes in parallel and to the ground.

The resonant capacitor C1 and the resonant inductor L1 connected in parallel to the transmission end of the PA resonate at low frequencies, thus increasing the feedback impedance of a low-frequency part.

Figure 2:
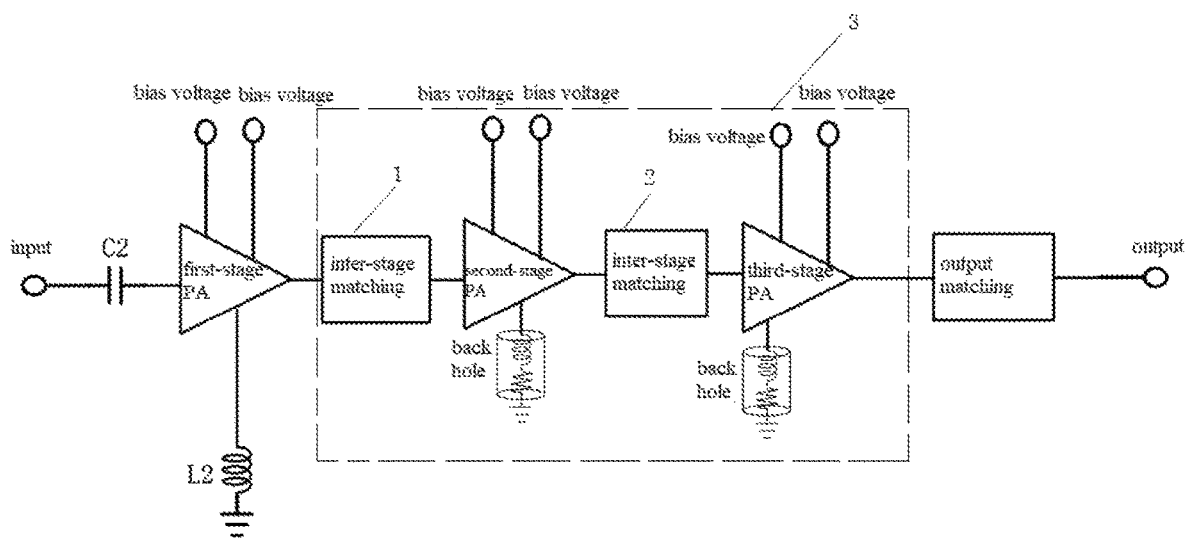
FIG. 2 is a three-stage amplification circuit structure of an existing PA.

As shown in FIG. 2, compared with the matching circuit structure shown in FIG. 1, which effectively suppresses the low-frequency clutter of the mobile phone power amplifier, a three-stage amplification circuit structure of an existing mobile phone PA has an obvious disadvantage that there is no frequency selecting network composed of a resonant inductor L1 and a resonant capacitor C1 connected in parallel at an input end.

Figure 3:
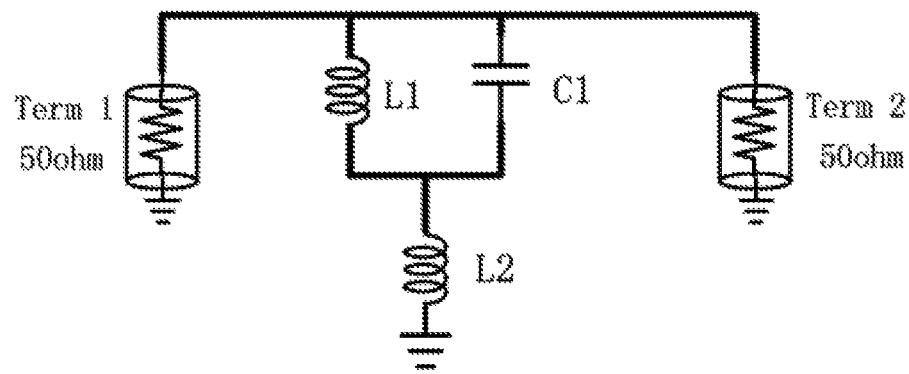
FIG. 3 is a simulation schematic diagram of a first-stage negative feedback network.

As shown in FIG. 3 which is a simulation schematic diagram of a first-stage negative feedback network, ADS is used to simulate the impedance of the negative feedback network, and both ends of the circuit are respectively connected to 50 Ohm ends to simulate the change of the impedance of an input end of the negative feedback network with frequency.

Figure 4:
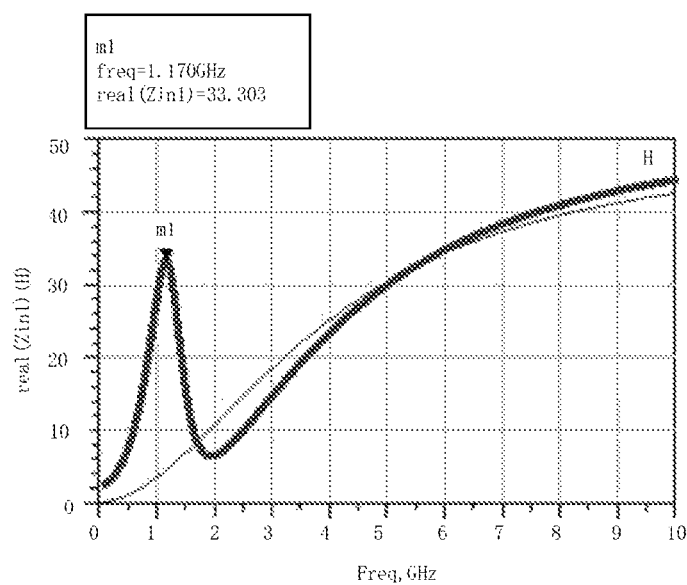
FIG. 4 shows the comparison of the simulation results of first-stage feedback impedance with and without a frequency selecting network.

As shown in FIG. 4, the simulation results of the first-stage feedback impedance with and without the frequency selecting network are compared. The thick line is the impedance simulation result with the frequency selecting network, while the thin line is the impedance simulation result without the frequency selecting network. It is obvious from the figure that the impedance around the low frequency 1.17 GHz is obviously higher for the simulation result with the frequency selecting network.

Figure 5:
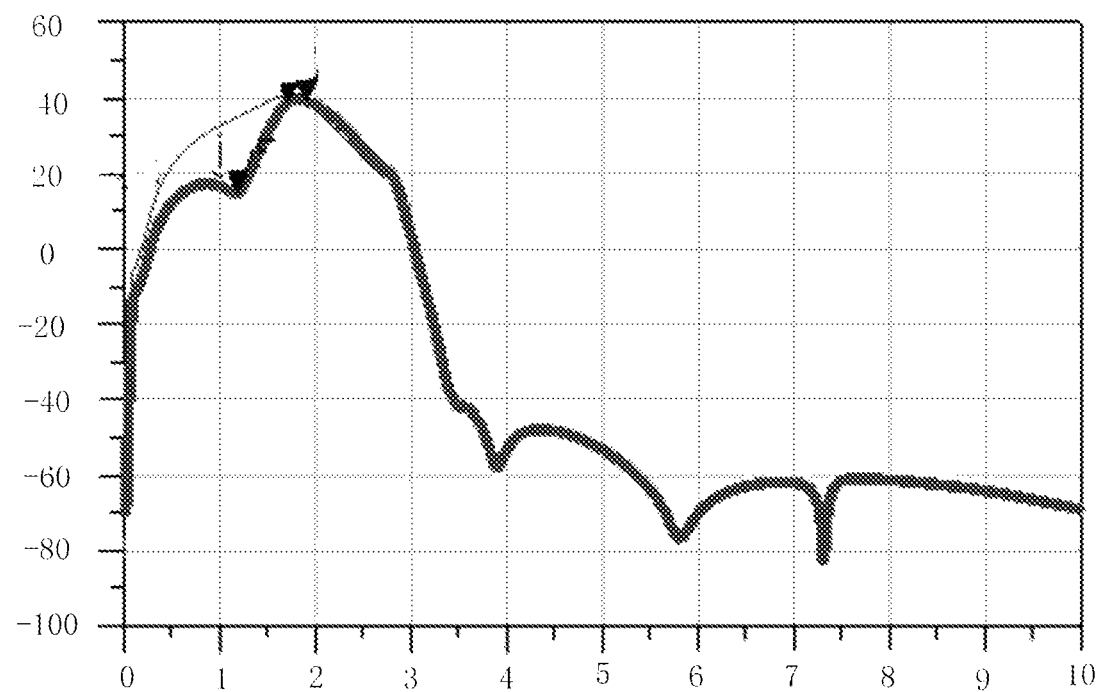
FIG. 5 is a transmission gain comparison simulation diagram between a PA circuit structure provided by the present invention and a conventional PA circuit structure.

As shown in FIG. 5, taking PA simulation of DCS (1800 MHz) and PCS (1900 MHz) mobile phone frequency bands as an example, a transmission gain comparison simulation diagram between the PA circuit structure provided by the present invention and a conventional PA circuit structure is shown, wherein the gray thick line is the simulation curve of the present invention, and the gray thin line is the simulation curve of the conventional circuit structure. As can be seen from the comparison in the figure, the signal transmission gain of the low-frequency part of the circuit structure of the present invention is obviously lower than that of the low-frequency part of the conventional circuit structure. As shown in FIG. 3, the matching circuit structure provided by the present invention effectively suppresses the low-frequency clutter around m5. Due to the low transmission gain of low-frequency signals, low-frequency clutter is effectively suppressed.

It should be noted that the various embodiments described above with reference to the drawings are only for the purpose of illustrating the present invention and not limiting the scope of the present invention, and those skilled in the art should understand that modifications or equivalent substitutions made to the present invention without departing from the spirit and scope of the present invention should be covered within the scope of the present invention.

What is claimed is:

1. A matching circuit structure for effectively suppressing low-frequency clutter of a power amplifier of a mobile phone, comprising: an input end, a blocking capacitor C2, a power amplifier (PA), an output matching network and an output end connected in series, wherein
   the matching circuit structure further comprises: a negative feedback network connected in parallel to a transmission end of the PA;
   the negative feedback network comprises a resonant capacitor C1, a resonant inductor L1 and a matching inductor L2;
   the resonant capacitor C1 and the resonant inductor L1 are connected in parallel to form a frequency-selecting network, and the frequency-selecting network is connected in series with the matching inductor L2 and to a ground; and
   the resonant capacitor C1 and the resonant inductor L1 connected in parallel to the transmission end of the PA resonate at low frequencies.

2. The matching circuit structure according to claim 1, further comprising one or more intermediate amplification units connected between the PA and the output matching network, wherein each said intermediate amplification unit comprises an inter-stage matching network and a PA sequentially connected in series.

3. The matching circuit structure according to claim 2, wherein the PA in each said intermediate amplification unit is connected to a back hole in parallel so as to be connected to the ground.

4. The matching circuit structure according to claim 1, wherein the PA is a three-stage PA amplification network comprising a first-stage PA, a negative feedback network, a first inter-stage matching network, a second-stage PA, a second inter-stage matching network and a third-stage PA; and
   the negative feedback network is connected in parallel to a transmitting end of the first-stage PA.

5. A method for suppressing low-frequency clutter by utilizing the matching circuit structure according to claim 1, comprising: connecting the negative feedback network in parallel to the transmission end of the PA of the matching circuit structure.

6. The method for suppressing the low-frequency clutter according to claim 5, wherein one or more intermediate amplification units are connected between the PA and the output matching network in the matching circuit structure, and each said intermediate amplification unit comprises an inter-stage matching network and a PA sequentially connected in series.

7. The method for suppressing the low-frequency clutter according to claim 6, wherein the PA in each said intermediate amplification unit is connected to a back hole in parallel so as to be connected to the ground.

* * * * *